United States Patent
Jaiswal et al.

(10) Patent No.: US 11,120,857 B2
(45) Date of Patent: Sep. 14, 2021

(54) LOW VARIABILITY REFERENCE PARAMETER GENERATION FOR MAGNETIC RANDOM ACCESS MEMORY

(71) Applicant: GLOBALFOUNDRIES U.S. Inc., Malta, NY (US)

(72) Inventors: Akhilesh Jaiswal, Ballston Spa, NY (US); Bipul C. Paul, Mechanicville, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 14 days.

(21) Appl. No.: 16/720,058

(22) Filed: Dec. 19, 2019

(65) Prior Publication Data
US 2021/0193204 A1 Jun. 24, 2021

(51) Int. Cl.
*G11C 11/16* (2006.01)
*H01L 27/22* (2006.01)
*H01L 43/08* (2006.01)

(52) U.S. Cl.
CPC ........ *G11C 11/161* (2013.01); *G11C 11/1655* (2013.01); *G11C 11/1659* (2013.01); *G11C 11/1673* (2013.01); *G11C 11/1675* (2013.01); *H01L 27/228* (2013.01); *H01L 43/08* (2013.01)

(58) Field of Classification Search
CPC .............. G11C 11/161; G11C 11/1655; G11C 11/1659; G11C 11/1673; G11C 11/1675
USPC .............. 365/158, 148, 210, 230.06, 230.08, 365/185.23
See application file for complete search history.

(56) References Cited

U.S. PATENT DOCUMENTS

| 6,982,908 | B2 * | 1/2006 | Cho | ........................ | G11C 7/14 365/158 |
| 7,733,729 | B2 | 6/2010 | Boeve | | |
| 7,835,210 | B2 * | 11/2010 | Shimizu | .................. | G11C 11/16 365/210.15 |

(Continued)

OTHER PUBLICATIONS

Asifuzzaman et al., "Enabling a Reliable STT-MRAM Main Memory Simulation", ACM, 2017, pp. 1-10.

(Continued)

*Primary Examiner* — Connie C Yoha
(74) *Attorney, Agent, or Firm* — Gibb & Riley, LLC

(57) ABSTRACT

Disclosed is a reference circuit having an even number m of groups of m parallel-connected magnetic tunnel junctions (MTJs). The MTJs in half of the groups are programmed to have parallel resistances (RP) and the MTJs in the other half are programmed to have anti-parallel resistances (RAP). Switches connect the groups in series, creating a series-parallel resistor network. The total resistance ($R_T$) of the network has low variability and is essentially equal to half the sum of a nominal RP plus a nominal RAP and can be employed as a reference resistance (RREF). Under specific biasing conditions the series-parallel resistor network can generate a low variability reference parameter (XREF) that is dependent on this RREF. Also disclosed are an integrated circuit (IC) that includes the reference circuit and a magnetic random access memory (MRAM) structure, which uses XREF to determine stored data values in MRAM cells and associated methods.

20 Claims, 11 Drawing Sheets

(56) References Cited

U.S. PATENT DOCUMENTS

| | | | |
|---|---|---|---|
| 7,952,916 B2* | 5/2011 | Maeda | G11C 11/1653 |
| | | | 365/158 |
| 9,734,883 B1 | 8/2017 | Yu et al. | |
| 10,726,896 B1* | 7/2020 | Jacob | G11C 11/1675 |
| 2005/0078531 A1 | 4/2005 | Lammers | |

OTHER PUBLICATIONS

Cai et al., "High Performance MRAM with Spin-Transfer-Torque and Voltage-Controlled Magnetic Anisotropy Effects", MDPI, Applied Sciences, 2017, 7, 929, pp. 1-13.

Wei et al., "13.3 A 7Mb STT-MRAM in 22FFL FinFET Technology with 4ns Read Sensing Time at 0.9 V Using Write-Verify-Write Scheme and Offset-Cancellation Sensing Technique", IEEE International Solid-State Circuits Conference, 2019, pp. 214-216.

Dong et al., "A 1-Mb 28-nm 1T1MTJ STT-MRAM With Single-Cap Offset-Cancelled Sense Amplifier and In Situ Self-Write-Termination", IEEE Journal of Solid-State Circuits, vol. 54, No. 1, 2019, pp. 231-239.

\* cited by examiner

LOW VARIABILITY REFERENCE PARAMETER GENERATION FOR MAGNETIC RANDOM ACCESS MEMORY

BACKGROUND

Field of the Invention

The present invention relates to magnetic random access memory (MRAM) structures and, more particularly, to embodiments of a reference circuit for generation of a reference parameter, to embodiments of an MRAM that employs the reference parameter for sensing operations and to embodiments of corresponding methods.

Description of Related Art

Resistive nonvolatile memory (NVM) structures, such as spin transfer torque-magnetic tunnel junction (STT-MTJ) magnetic random access memory (MRAM) structures and voltage-controlled magnetic anisotropy-magnetic tunnel junction (VCMA-MTJ) MRAM structures, are currently being considered by integrated circuit designers as suitable replacements for other on-chip memory arrays because of advantages including high speed, low power consumption, non-volatility and potentially low area consumption.

An MRAM structure typically includes an array of MRAM cells (e.g., STT-MTJ MRAM cells or VCMA-MTJ MRAM cells) arranged in columns and rows. The simplest MRAM cell includes a single field effect transistor (FET) (e.g., an n-type field effect transistor (NFET)) and a single variable resistor and, particularly, a single magnetic tunnel junction (MTJ). The FET and MTJ are connected in series between a source line and a bitline with the gate of the FET controlled by the state of a wordline. An MTJ is a back end of the line (BEOL) multi-layer structure, which includes a fixed ferromagnetic layer (also referred to as a pinned layer) and a switchable ferromagnetic layer (also referred to as a free layer) separated by a thin dielectric layer (e.g., a thin oxide layer).

Depending upon the biasing conditions employed during a write operation, the MTJ-type variable resistor will exhibit either a low resistance or a high resistance. More specifically, during a write operation, a high positive voltage (VDD) can be applied to the wordline and the bitline. The source line can be connected to ground. In this case, current flows from the bitline toward the source line such that the free layer switches to (or maintains) a parallel resistance (RP) state (also referred as a low resistance state), thereby storing a logic value of "0" in the MRAM cell. Alternatively, VDD can be applied to the wordline and the source line and the bitline can be connected to ground. In this case, current flows from the source line toward the bitline such that the free layer switches to (or maintains) the anti-parallel resistance (RAP) state (also referred to as a high resistance state), thereby storing a logic value "1" in the MRAM cell.

During a read operation, VDD is applied to the wordline, a low positive voltage, referred to herein as a read voltage (VREAD), is applied to the bitline and the source line is connected to ground. An MTJ in the RP state (i.e., storing a logic "0") will be indicated by a low voltage on the bitline and an MTJ in the RAP state (i.e., storing a logic "1") will be indicated by a high voltage on the bitline.

In order to detect whether a logic "0" or a logic "1" is stored in a selected MRAM cell, a sense amplifier (SA) can be employed to compare a bitline parameter (XDATA) to a reference parameter (XREF). For example, the SA can compare a bitline voltage (VDATA) to a reference voltage (VREF). Alternatively, the SA could compare a bitline current (IDATA) to a reference current (IREF). In any case, the reference parameter (e.g., VREF or IREF) is typically supplied by a reference cell, which is designed to generate the reference parameter based on a reference resistance (RREF) that is midway between the RP and the RAP of the MTJ so that:

$RREF=(RP+RAP)/2.$

Unfortunately, with the current technologies, the RREF exhibited by reference cells can be highly variable due to inherent process and thermal variations. A highly variable RREF can lead to a highly variable reference parameter (e.g., a highly variable VREF or a highly variable IREF), which can be problematic and, more particularly, can lead to read errors.

SUMMARY

Disclosed herein are embodiments of a reference circuit. The reference circuit can include groups of parallel-connected magnetic tunnel junctions (MTJs). The reference circuit can further include a programming circuit, which is connected to each of the groups of parallel-connected MTJs and which is configured so that the parallel-connected MTJs in half of the groups are programmable to have a parallel resistance state and so that the parallel-connected MTJs in another half of the groups are programmable to have an anti-parallel resistance state. The reference circuit can further include switches, which are selectively operable to form a series-parallel resistor network by electrically connecting the groups in series. For purposes of this disclosure, it should be understood that a series-parallel resistor network refers to groups of parallel-connected MTJs, wherein the groups are series-connected. The total resistance of such a series-parallel resistor network can be employed as a low variability reference resistance (RREF) and used to generate of one or more other reference parameters. Specifically, under specific biasing conditions, the series-parallel resistance network can generate a reference parameter (XREF) (e.g., a reference voltage (VREF), a reference current (IREF), etc.) and this XREF can be dependent on the total resistance of the network. The reference circuit can further include a reference parameter output block that outputs XREF.

Also discussed herein are embodiments of an integrated circuit (IC) that incorporates a magnetic random access memory (MRAM) structure and that further incorporates the above-described reference circuit for providing a low variability reference parameter to the MRAM structure for use during sensing operations. Specifically, the IC can include a reference circuit and an MRAM structure. The reference circuit can include groups of parallel-connected magnetic tunnel junctions (MTJs). The reference circuit can further include a programming circuit, which is connected to each of the groups of parallel-connected MTJs and which is configured so that the parallel-connected MTJs in half of the groups are programmable to have a parallel resistance state and so that the parallel-connected MTJs in another half of the groups are programmable to have an anti-parallel resistance state. The reference circuit can further include switches, which are selectively operable to form a series-parallel resistor network by electrically connecting the groups in series. The total resistance of such a series-parallel resistor network can be employed as a low variability reference resistance (RREF) and used to generate one or more other reference parameters. Specifically, under specific biasing conditions, the series-parallel resistance network can generate a reference parameter (XREF) (e.g., a reference voltage (VREF), a reference current (IREF), etc.) and this XREF can be dependent on the total resistance of the network. The reference circuit can further include a reference parameter output block that outputs XREF. The MRAM structure can include a magnetic random access memory (MRAM) array. The MRAM structure can also include a sensing circuit operably connected to the MRAM array. The sensing circuit can include at least one sense amplifier. During a sensing operation (e.g., to determine the stored data value in a selected MRAM cell in the MRAM array), the sense amplifier can compare a bitline parameter from a bitline connected to the selected cell to the XREF from the reference parameter output block. Depending upon on whether the bitline parameter is above or below XREF, the output of the sense amplifier will indicate whether the stored data value is a logic "1" or a logic "0".

Also disclosed herein are method embodiments for operating the above-described structures. The method embodiments can include concurrently programming groups of parallel-connected magnetic tunnel junctions in a reference circuit. This process of concurrently programming the groups of parallel-connected MTJs is performed using a programming circuit of the reference circuit. The process of concurrently programming the groups of parallel-connected MTJs is further performed by the programming circuit such that the parallel-connected MTJs in half of the groups will have a parallel resistance state and such that the parallel-connected MTJs in the other half of the groups will have the anti-parallel resistance state. The method embodiments can further include, after concurrently programming the groups of parallel-connected MTJs, turning on switches between the groups so as to electrically connect the groups in series (i.e., so that the groups are series-connected), thereby forming a series-parallel resistor network in the reference circuit. For purposes of this disclosure, it should be understood that a series-parallel resistor network refers to groups of parallel-connected MTJs, wherein the groups are series-connected. The method embodiments can further include applying specific biasing conditions to the series-parallel resistor network to generate a reference parameter (XREF) (e.g., a reference voltage (VREF) or a reference current (IREF)) as a function of the total resistance of the series-parallel resistor network. The method embodiments can further include determining the stored data value in a selected magnetic random access (MRAM) cell in a MRAM array of an MRAM structure using the reference.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
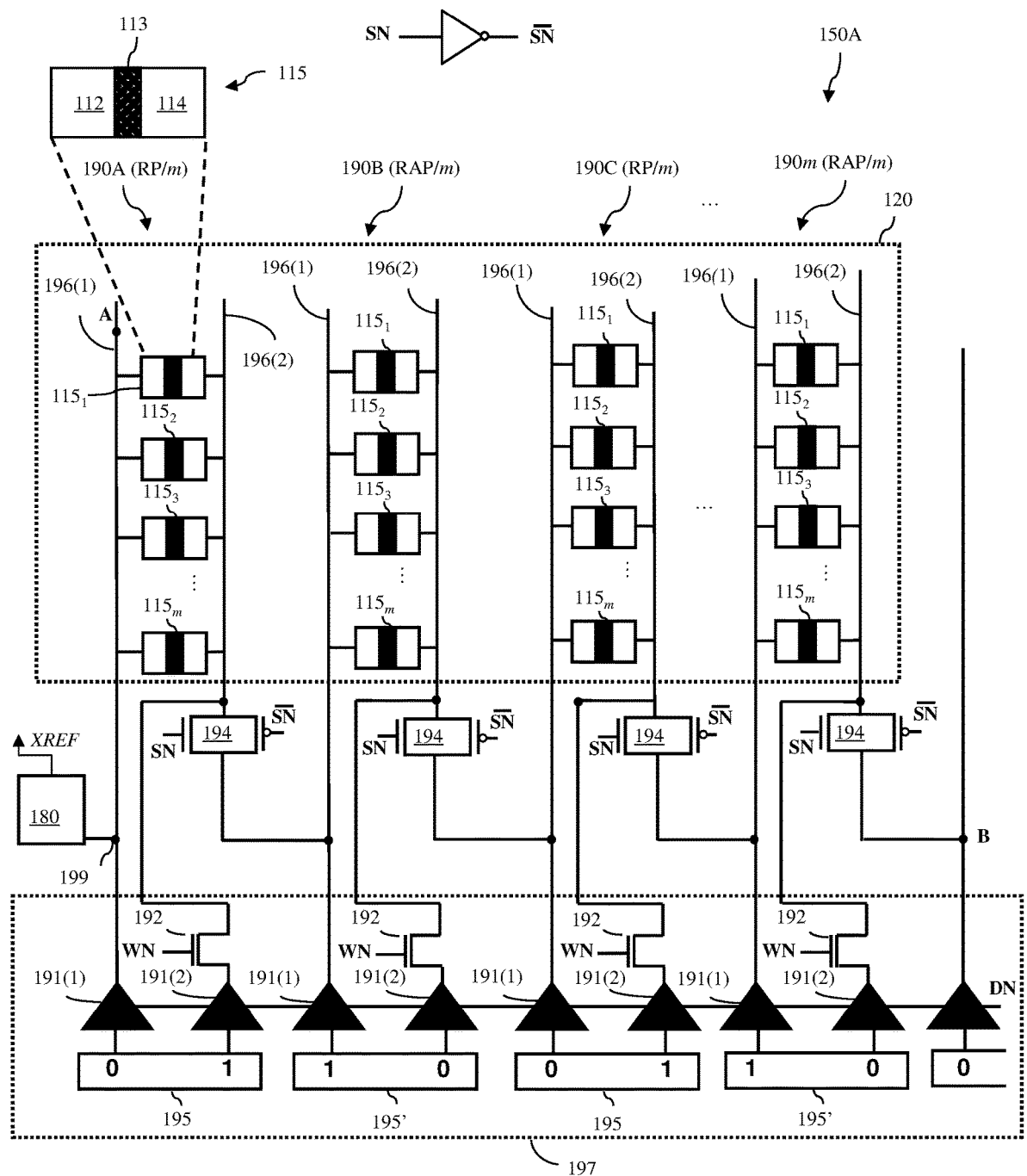
FIG. 1A is a schematic diagram illustrating an embodiment of a reference circuit.

As mentioned above, to read a selected magnetic random access memory (MRAM) cell in a given row and column of in an MRAM array, VDD is applied the wordline for the row, a low positive voltage, referred to herein as a read voltage (VREAD), is applied to the bitline for the column and the source line for the column is connected to ground. If the MTJ of the selected MRAM cell is in the RP state (i.e., storing a logic "0") a low voltage will be exhibited on the bitline and if the MTJ of the selected MRAM cell is in the RAP state (i.e., storing a logic "1") then a high voltage will be exhibited on the bitline.

In order to detect whether the selected MRAM cell is storing a logic "1" or a logic "0", a sense amplifier (SA) can be employed to compare a particular bitline parameter (XDATA) to a reference parameter (XREF). For example, the SA can compare a bitline voltage (VDATA) to a reference voltage (VREF). Alternatively, the SA could compare a bitline current (IDATA) to a reference current (IREF). In any case, the reference parameter (e.g., VREF or IREF) can be supplied by a reference circuit, which is designed to generate the reference parameter based on a reference resistance (RREF) that is midway between the resistance of a nominal MTJ in the RP state (i.e., $RP_N$) and the resistance of a nominal MTJ in the RAP state (i.e., $RAP_N$) or, more particularly, so that:

$RREF=(RP_N+RAP_N)/2$.

If the RREF is midway between the $RP_N$ and the $RAP_N$, then the reference parameter (XREF), which is generated based on this RREF, will be midway between the two different parameter values that would be exhibited on the bitline when the nominal MTJ is in the RP state ($X_{RPN}$) and when the nominal MTJ is in the RAP states (i.e., $X_{RAPN}$). That is, $XREF=(X_{RPN}+X_{RAPN})/2$, Unfortunately, with the current technologies, generating a low variability XREF can be difficult due to inherent process and thermal variations and a high variability RREF can lead to a high variability XREF, which can lead to read errors when the difference between $X_{RPN}$ and $X_{RAPN}$ is relatively small.

In view of the foregoing, disclosed herein are embodiments of a reference circuit that includes an even number (m) of groups of parallel-connected magnetic tunnel junctions (MTJs) with each group having the same even number (m) of MTJs. The reference circuit can include a programming circuit configured so that the MTJs in half of the groups are programmable to have parallel resistance (RP) states and so that the MTJs in the other half are programmable to have anti-parallel resistance (RAP) states. Switches (e.g., transmission gates) can electrically connect the groups in series in order to create a series-parallel resistor network. Due to the m parallel-connected MTJs in each group and the m series-connected groups programmed as described, the total resistance ($R_T$) of the network has low variability and is essentially equal to half the sum of a nominal parallel resistance ($RP_N$) (i.e., the RP of a nominal MTJ) and a nominal anti-parallel resistance ($RAP_N$) (i.e., the RAP of a nominal MTJ). Thus, the total resistance ($R_T$) of the network can be employed as a low variability reference resistance (RREF). Under specific biasing conditions, the series-parallel resistor network can generate a low variability reference parameter (XREF), which is dependent on RREF and which is midway between the two parameter values: a first parameter value associated with the RP state ($X_{RPN}$) of a nominal MTJ and a second parameter value associated with the RAP state (i.e., $X_{RAPN}$) of the nominal MTJ. Also disclosed herein are embodiments of an integrated circuit (IC) structure that includes the reference circuit and a magnetic random access memory (MRAM) structure that uses the reference parameter (XREF) from the reference circuit to determine stored data values in selected MRAM cells. Also disclosed herein are method embodiments for operating the disclosed structures.

Figure 1B:
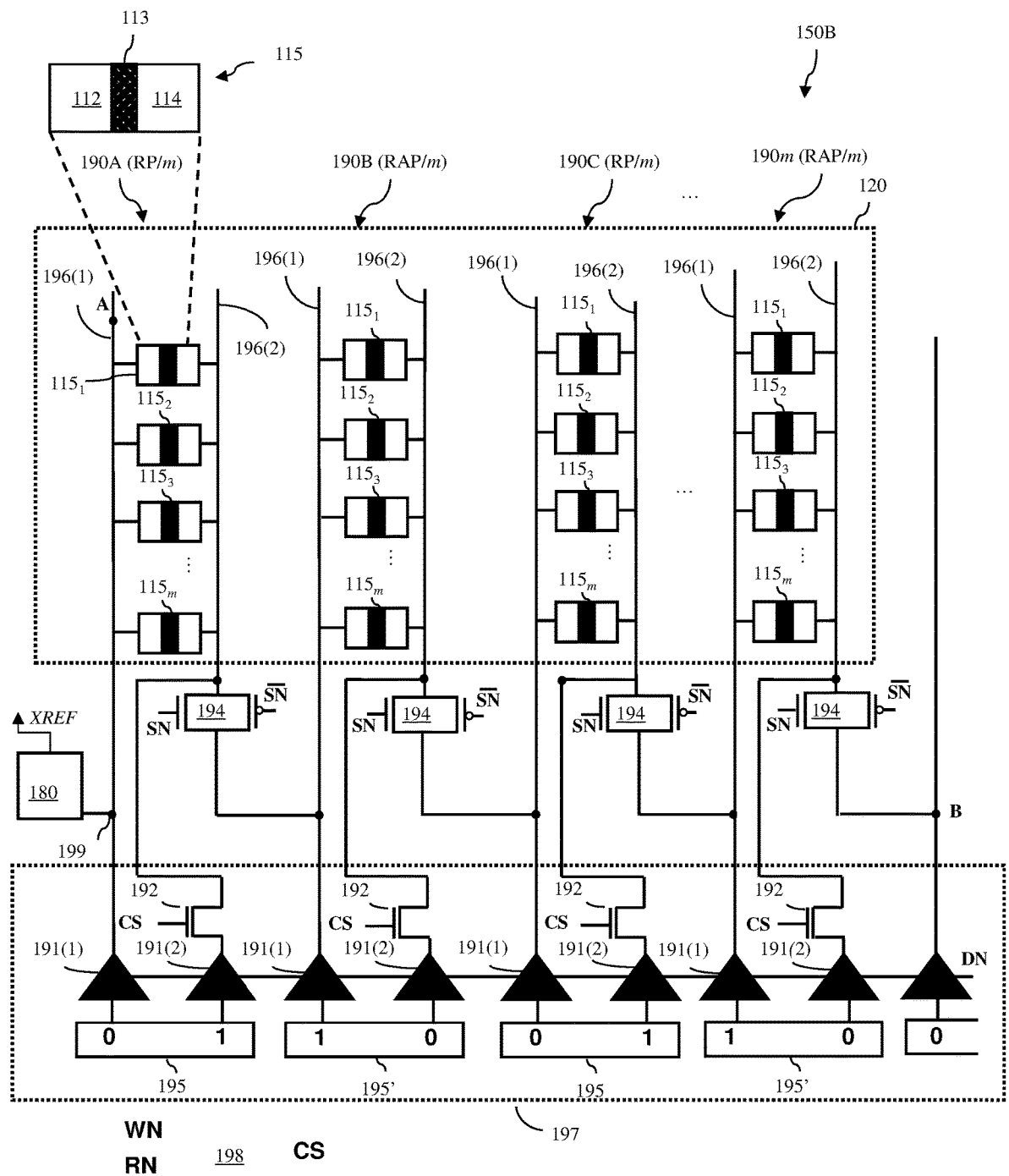
FIG. 1B is a schematic diagram illustrating another embodiment of a reference circuit.
Figure 2A:
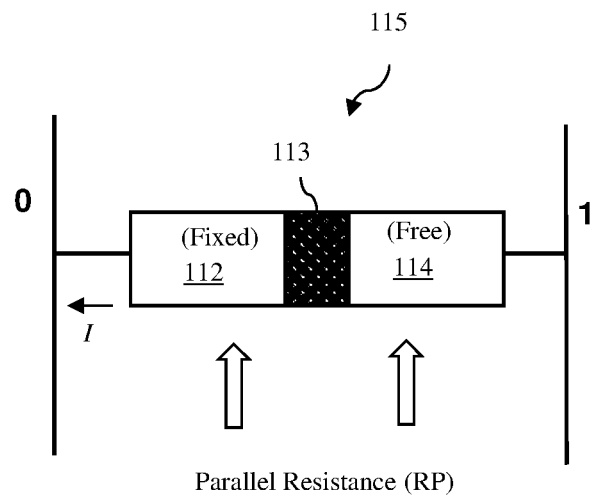
FIGS. 2A and 2B are drawings illustrating the parallel resistance state and the anti-parallel resistance state, respectively, of a magnetic tunnel junction.
Figure 2B:
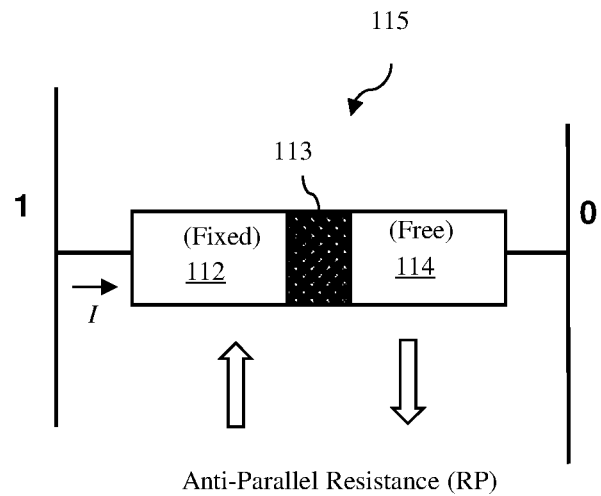
Figure 3A:
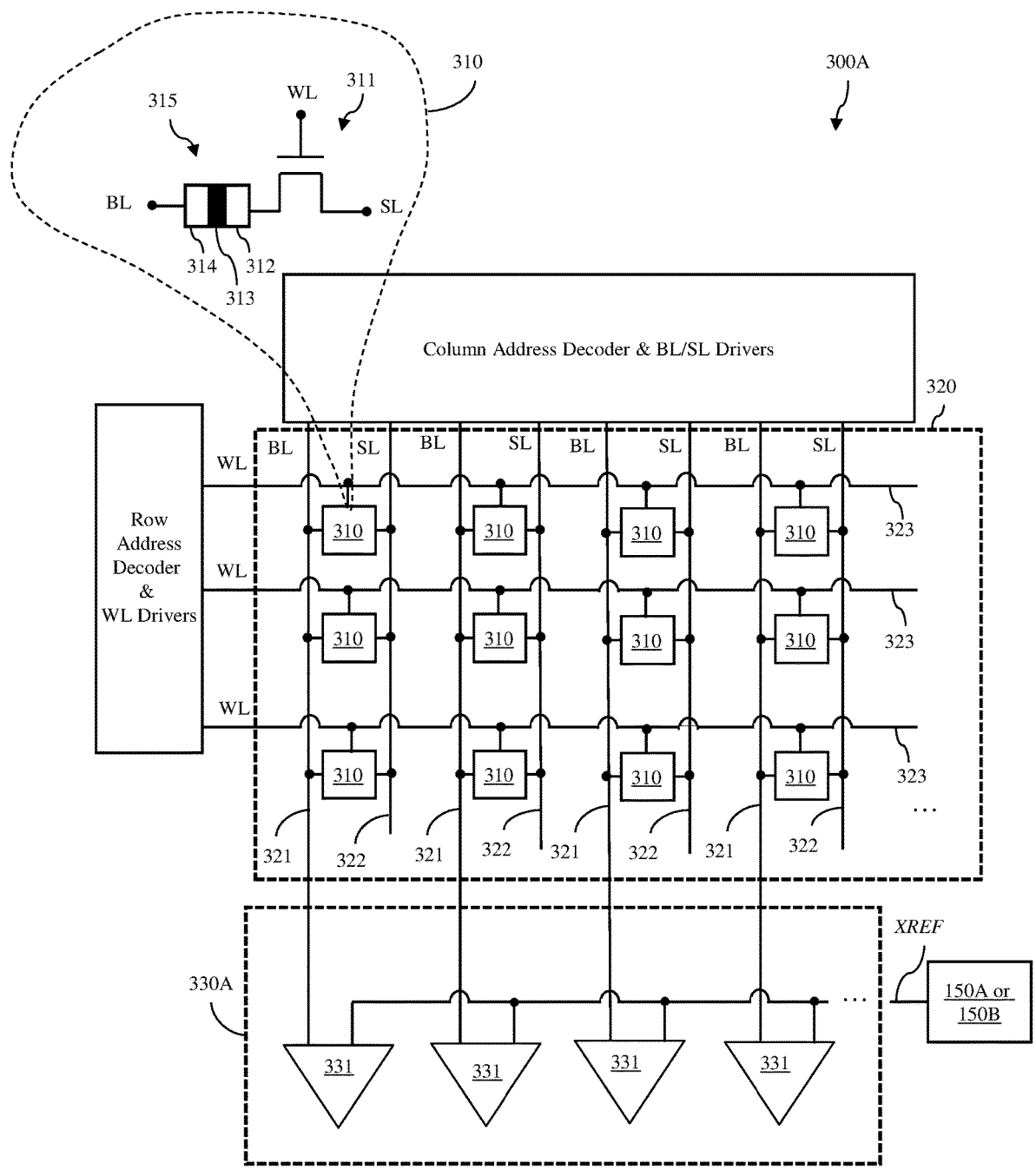
FIG. 3A is a schematic diagram illustrating an embodiment of an integrated circuit that incorporates an magnetic random access memory (MRAM) structure and the reference circuit of FIG. 1A or 1B.
Figure 3B:
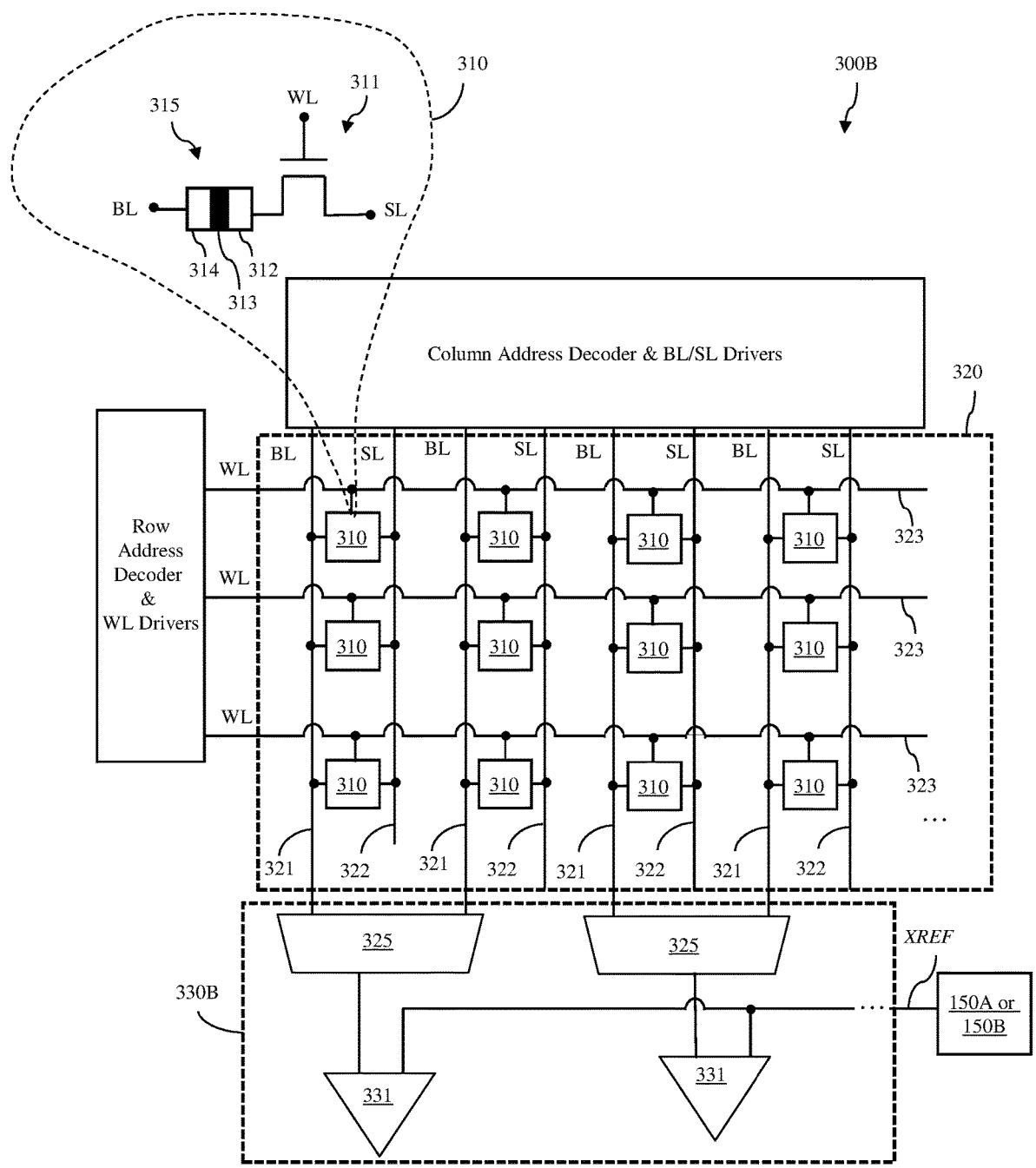
FIG. 3B is a schematic diagram illustrating another embodiment of an integrated circuit that incorporates an magnetic random access memory (MRAM) structure and the reference circuit of FIG. 1A or 1B.

More particularly, FIGS. 1A and 1B are schematic diagrams illustrating disclosed embodiments of a reference circuit 150A and 150B, respectively, each of which includes an array 120 of magnetic tunnel junctions (MTJs) (see the exemplary MTJ 115 illustrated in FIGS. 2A and 2B). FIGS. 3A and 3B are schematic diagrams illustrating disclosed embodiments of a magnetic random access memory (MRAM) structure 300A and 300B, respectively, each of which includes an array 320 of MRAM cells (see the exemplary MRAM cells illustrated in FIGS. 4A and 4B and described in greater detail below, such MRAM cells can be spin transfer torque-magnetic tunnel junction (STT-MTJ) MRAM cells or voltage-controlled magnetic anisotropy-magnetic tunnel junction (VCMA-MTJ) MRAM cells) and a sensing circuit 330A or 330B that uses a reference parameter (XREF) received from the reference circuit 150A or 150B to determine stored data values in selected MRAM cells within the array 320 of MRAM cells.

Referring to FIGS. 1A and 1B, the reference circuit 150A, 150B can include multiple groups 190A-190m of parallel-connected magnetic tunnel junctions (MTJs) 115$_1$-115$_m$. Specifically, groups 190A-190m of MTJs can be arranged in columns, respectively. Each MTJ 115$_1$-115$_m$ in each group can be multi-layer structure, which includes a fixed ferromagnetic layer 112 (also referred to as a pinned layer), a switchable ferromagnetic layer 114 (also referred to as a free layer), and a thin dielectric layer 113 (e.g., a thin oxide layer) between and in contact with the pinned layer 112 and the free layer 114. The MTJs in each group can be connected in parallel between a corresponding pair of wires (i.e., a first wire 196(1) and a second wire 196(2)) with the pinned layer 112 of each MTJ being electrically connected to the first wire 196(1) and the free layer 114 being electrically connected to the second wire 196(2). It should be noted that the total number of groups of parallel-connected MTJs can be some even number (m). For purposes of illustration, four groups of parallel-connected MTJs are shown in the figures. However, it should be understood that the figures are not intended to be limiting. Alternatively, 2, 6, 8, 10, 12, or some other even number (m) of groups of parallel-connected MTJs could be incorporated into the reference circuit 150A, 150B. Additionally, each of the m groups can include that same number (m) of MTJs. Optionally, field effect transistors (FETs) can be connected in series with the MTJs, respectively, in each group (not shown).

The reference circuit 150A, 150B can further include a programming circuit 197, which is connected to each of the m groups 190A-190m and which is configured to concurrently program the MTJs in each of the m groups during the same programming operation. Specifically, this programming circuit 197 can be configured so that, during a programming operation, the parallel-connected MTJs in half of the m groups are programmable to have a parallel resistance (RP) state and so that the parallel-connected MTJs in the other half of the m groups are programmable by the programming circuit to have an anti-parallel resistance (RAP) state.

For example, for each of the m groups, the programming circuit 197 can include a pair of write drivers (i.e., a first write driver 191(1) and a second write driver 191(2)) and an access transistor 192 (e.g., an n-type field effect transistor). The output of the first write driver 191(1) can be electrically connected directly to the first wire 196(1). The access transistor 192 can be electrically connected in series between the output of the second write driver 191(2) and the second wire 196(2). For each of the m groups, the programming circuit 197 can also include a flip-flop having a first output connected to the input of the first write driver 191(1) and a second output connected to the input of the second write driver 191(2). Half of the flip-flops in the programming circuit 197 can be first flip-flops 195, which are configured so that the first output to the first write driver 191(1) is a low logic value (i.e., logic "0") and so that the second output to the second write driver 191(2) is a high logic value (i.e., a logic "1"). Each first group that is connected to such a first flip-flop 195 will be programmable to have the parallel resistance state. Half of the flip-flops in the programming circuit 197 can be second flip-flops 195', which are configured so that the first output to the first write driver 191(1) is the high logic value (i.e., logic "1") and so that the second output to the second write driver 191(2) is the logic value (i.e., a logic "0"). Each second group that is connected to such a second flip-flop 195' will be programmable to have the anti-parallel resistance state.

All of the write drivers 191(1) and 191(2) in the programming circuit 197 can be controlled by the same write driver enable signal (DN) and all of the access transistors 192 in the programming circuit 197 can be controlled by the same write enable signal (WN) (e.g., as shown in the embodiment of the reference circuit 150A of FIG. 1A). In this case, the programming circuit 197 can initiate concurrent magnetic tunnel junction resistance programming in the groups whenever DN and WN both have high logic values, thereby turning on the first write driver 191(1), the second write driver 191(2) and the access transistor 192 connected to each group. Within each first group connected to a first flip-flop 195, this results in the low logic value being applied to the first wire 196(1) and the high logic value being applied through the access transistor 192 to the second wire 196(2), thereby causing current to flow from the second wire 196(2) through the MTJs 115$_1$-115$_m$ to the first wire 196(1) and creating parallel resistance (RP) states in the MTJs 115$_1$-115$_m$ (e.g., see FIG. 2A). Within each second group connected to a second flip-flop 195', this results in the high logic value being applied to the first wire 196(1) and the low logic value being applied through the access transistor 192 to the second wire 196(2), thereby causing current to flow from the first wire 196(1) through the MTJs $115_1$-$115_m$ to the second wire 196(2) and creating anti-parallel resistance (RAP) states in the MTJs $115_1$-$115_m$ (e.g., see FIG. 2B).

It should be noted that DN and WN signals can be the same DN and WN signals employed by the MRAM during write operations such that each time a write operation is performed in the MRAM the MTJs in the groups 190A-190m will be reprogrammed. However, reprogramming of the MTJs during every write operation in the MRAM may be unnecessary and can be costly in terms of power consumption. Therefore, in order to minimize power consumption, reprogramming of the MTJs can be controlled so that it occurs less frequency. For example, the programming circuit 197 of the reference circuit 150A of FIG. 1B further includes a AND gate 198 that receives the write enable signal (WN) and a reference enable signal (RN) and outputs a programming control signal (CS), which controls all of the access transistors 192 in the programming circuit 197. The AND gate 198 can be configured to output CS according to a conventional AND gate truth table such that CS only has a high logic value when both WN and RN have high logic values. Thus, in this case, the programming circuit 197 only initiates concurrent magnetic tunnel junction resistance programming (in the same manner as described above and shown in FIGS. 2A and 2B) whenever DN, WN, RN (and thereby CS) have high logic values. RN can be generated so that it switches to high less frequently than WN and, thus, so that reprogramming only occurs concurrently with every $x^{th}$ write operation in the MRAM (e.g., with every $10^{th}$ write operation in the MRAM, with every $100^{th}$ write operation in the MRAM, with every $1000^{th}$ write operation in the MRAM, etc.). It should be understood that the schedule for reprogramming of the MTJs can be predetermined to ensure that the MTJs maintain the desired resistance states.

The reference circuit 150A, 150B can further include switches 194 that are operable (e.g., during a sensing operation in the MRAM) to electrically connect the m groups in series, thereby forming a series-parallel resistor network. Specifically, each switch 194 can have nodes connected to the second wire 196(2) of one group and the first wire 196(2) on an adjacent group. For example, as illustrated a switch 194 has nodes connected to the second wire 196(2) of the group 190A and to the first wire 196(1) of the group 190B, another switch 194 has nodes connected to the second wire 196(2) of the group 190B and to the first wire 196(1) of the group 190C, and so on. All of the switches 194 can be controlled by the same control signal(s) so that they can be concurrently turned off (e.g., during concurrent resistance programming of the parallel-connected MTJs in the groups) or concurrently turned on (e.g., at the initiation of a sensing operation in the MRAM).

For example, each switch 194 can be transmission gate with an n-type field effect transistor (NFET) and a p-type field effect (PFET) connected in parallel between nodes on the wires of adjacent groups. The NFET can be controlled by a sense enable signal (SE) (which is employed in the MRAM to initiate a sensing operation) and the PFET can be controlled by an inverted sense enable signal (SEbar). When SE has a low logic value and SEbar has a high logic value, the NFET and PFET, respectively, of each transmission gate 194 will be off so that the groups 190A-190m of parallel-connected MTJs are disconnected and can be concurrently programmed by the programming circuit 197 (as discussed above) so as to have different resistance states. After concurrent resistance programming, the programming circuit 197 can be disabled (i.e., DN and WN can switch to low in the programming circuit 197 of the reference circuit of FIG. 1B or DN and CS can switch to low in the programming circuit 197 of the reference circuit 150B of FIG. 1B). Additionally, all the transmission gates 194 can be concurrently turned on by switching SE to the high and SEbar to the low, thereby electrically connecting the m groups 190A-190m in series. Electrically connecting the m groups 190A-190m in series results in the creation of a series-parallel resistor network. For purposes of this disclosure, it should be understood that a series-parallel resistor network refers to groups of parallel-connected MTJs, wherein the groups are series-connected.

Due to the m parallel-connected MTJs in each group and the m series-connected groups that are programmed according to the above-described programming scheme (i.e., half of the groups having parallel-connected MTJs in the RP state and half of the groups having parallel-connected MTJs in the RAP state), the total resistance ($R_T$) of the network (e.g., detected at node 199) will have low variability and will be essentially equal to half the sum of a nominal parallel resistance ($RP_N$) (i.e., the RP of a nominal MTJ) and a nominal anti-parallel resistance ($RAP_N$) (i.e., the RAP of the nominal MTJ). That is, $R_T \approx (RP_N + RAP_N)/2$. Thus, the total resistance ($R_T$) of the series-parallel resistor network can be employed as a low variability reference resistance (RREF).

Under specific biasing conditions, this series-parallel resistor network can generate (i.e., can be adapted to output, can be configured to output, etc.) a low variability reference parameter (XREF) that is dependent on the low variability reference resistance (RREF) (i.e., the total resistance ($R_T$) of the series-parallel resistor network). This reference parameter could be a low variability reference voltage (VREF). Alternatively, the reference parameter could be a low variability reference current (IREF). In any case, the low variability XREF that is generated can specifically be generated based on the low variability RREF and specific biasing conditions applied such that it is at a level midway between two parameter values: a first parameter value associated with the RP state ($X_{RPN}$) of the nominal MTJ and a second parameter value associated with the RAP state (i.e., $X_{RAPN}$) of the nominal MTJ. For example, in the case of VREF, the VREF can be generated so that it is essentially midway between a low voltage (e.g., associated with the RP state of a nominal MTJ) and a high voltage (e.g., associated with the RAP state of a nominal MTJ). It should be noted that the specific biasing conditions used to generate the reference parameter can include applying the read voltage (VREAD) to only the first wire 196(1) of the first group 190A (e.g., through node A) and connecting the second wire 196(2) of the last group 190m to ground (e.g., through node B). As discussed below, VREAD is a relatively low voltage (as compared to VDD) and is it applied to the bitline of a selected MRAM cell during a read operation.

The reference circuit 150A, 150B can further include a reference parameter output block 180 that outputs the reference parameter (XREF).

The above-described reference circuit 150A of FIG. 1A or 150B of FIG. 1B could be connected to a sensing circuit of a magnetic random access memory (MRAM) structure in order to provide a low variability reference parameter (XREF) (e.g., a low variability reference voltage (VREF) or a low variability reference current (IREF)) for use during sense operations (e.g., to determine the stored data values in selected MRAM cells).

More specifically, also disclosed herein are embodiments of an integrated circuit (IC) (e.g., see the exemplary ICs 300A shown in FIG. 3A and 300B shown in FIG. 3B). Each embodiment of the IC 300A, 300B can include at least one reference circuit 150A or 150B, as described above, and a memory structure.

The memory structure can include an array 320 of MRAM cells 310 (e.g., STT-MTJ MRAM cells, VCMA-MTJ MRAM cells, or any other suitable MTJ-based MRAM cells) arranged in columns and rows. Each column can have a corresponding source line (SL) 322 and a corresponding bitline (BL) 321 and each row having a corresponding wordline (WL) 323.

Each MRAM cell 310 in the array 320 can include a single n-type field effect transistor (NFET) 311 and a single magnetic tunnel junction (MTJ) 315 (which functions as a variable resistor) connected in series between the source line 322 and the bitline 321 for a particular column. Each MTJ 315 in each MRAM cell 310, like the MTJs 115 discussed above with regard to the reference circuit, includes a pinned layer 312 (also referred to as a pinned layer), a switchable ferromagnetic layer 314 (also referred to as a free layer), and a thin dielectric layer 313 (e.g., a thin oxide layer) between and in contact with the pinned layer 312 and the free layer 314. In each MRAM cell 310, the free layer 314 of the MTJ 315 can be electrically connected to the bitline for a given column, the pinned layer 312 of the MTJ 315 can be electrically connected to the drain region of the NFET 311, the source region of the NFET 311 can be electrically connected to the source line for the given column, and the gate of the NFET can be electrically connected to the wordline for a given row. As illustrated, all MRAM cells 310 in the same column are connected between the same source line 322 and the same bitline 321. Furthermore, all MRAM cells 310 in the same row have a transistor gate controlled by the same wordline 323.

The memory structure can further include a memory controller (e.g., a computer processing unit (CPU)) (not shown) that is operably connected to the memory array and that provides various control signals for controlling the memory array operations. Such control signals can include, for example, address signals (e.g., row and column address) as well as read, write or standby signals. Peripheral circuitry including, but not limited to, column address decode logic, bit line and source line drivers, row address decode logic and wordline drivers facilitate writing data values to and reading data values from the memory cells in the memory array based on these control signals. Such peripheral circuitry is well known in the art and, thus, the details of this circuitry has been omitted from the specification in order to allow the reader to focus on the salient aspects of the disclosed embodiments.

The memory structure can further include a sensing circuit that is connected to the reference circuit(s) 150A or 150B and configured to use the reference parameter (XREF) from a reference circuit to read stored data values in selected MRAM cells in the array.

Specifically, the sensing circuit 330A of the memory structure in the IC 300A of FIG. 3A can include a sense amplifier 331 for each column. That is, each bitline (BL) for each column of MRAM cells can be connected to a corresponding sense amplifier 331. The sensing circuit 330B of the memory structure in the IC 300B of FIG. 3B can include a sense amplifier 331 shared by multiple columns. That is, alternatively, multiple bitlines of multiple columns could be connected to the same sense amplifier 331 via a multiplexor 325 (e.g., as shown in FIG. 3B).

It should be noted that the exemplary ICs 300A and 300B shown in FIGS. 3A and 3B are provided for illustration purposes and are not intended to be limiting. For example, the sensing circuit 330B of the memory structure in the IC 300B is shown with two bitlines per multiplexor. However, it should be understood that a sensing circuit of the memory structure could, alternatively, have more bitlines (e.g., 3, 4, etc.) per multiplexor. Furthermore, each of the sensing circuits 330A and 330B of the memory structures in the ICs 300A and 300B, respectively, are only shown as being connected to a single reference circuit 150A or 150B. However, it should be understood that, alternatively, a sensing circuit of a memory structure could employ multiple reference circuits. For example, a sensing circuit for a memory array could include reference circuits on the left and right sides of the array with one reference circuit supplying a first reference parameter (XREF1) for reading the stored data values in the MRAM cells in the left-side columns and another reference circuit supplying a second reference parameter (XREF2) for reading the stored data values in the MRAM cells in the right-side columns.

The memory structure can have multiple operating modes including a standby mode, a write mode and a read mode (also referred to herein as a sensing mode).

During the standby mode, the memory controller can cause the wordlines, bitlines and source lines to all be connected to ground.

Figure 4A:
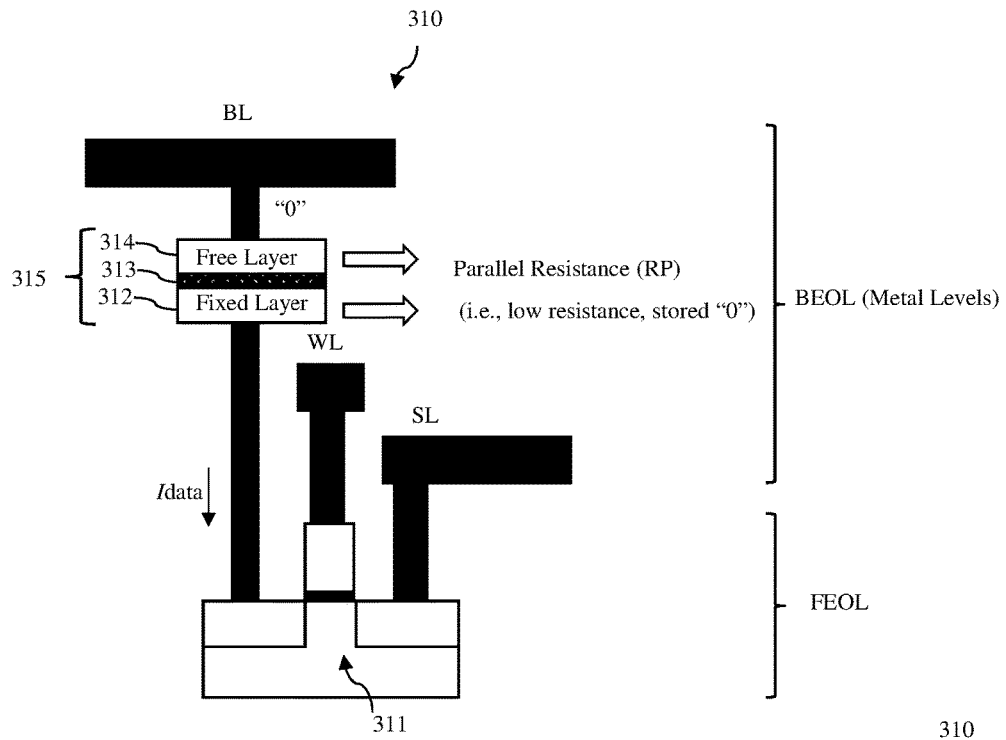
FIGS. 4A and 4B are drawings illustrating MRAM cells storing a "0" data value and a "1" data value, respectively.
Figure 4B:
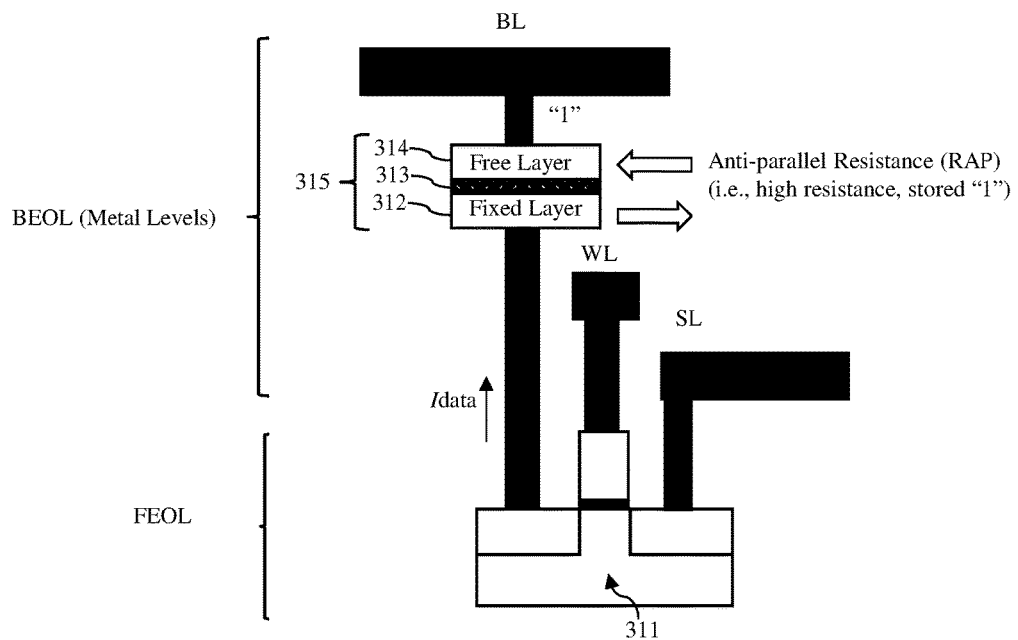

During the write mode, the controller can cause a write operation to be performed in order to store a data value of "0" or "1" in a selected MRAM cell. Specifically, a high positive voltage (VDD) can be applied to the wordline and the bitline of a selected MRAM cell and the source line can be connected to ground. In this case, current flows from the bitline toward the source line such that the free layer switches to (or maintains) the parallel state (also referred to as a low resistance state), thereby storing a logic value of "0" in the MRAM cell (as shown in FIG. 4A). Alternatively, VDD can be applied to the wordline and the source line and the bitline can be connected to ground. In this case, current flows from the source line toward the bitline such that the free layer switches to (or maintains) the anti-parallel resistance state (also referred to as a high resistance state), thereby storing a logic value "1" in the MRAM cell (as shown in FIG. 4B).

During the read mode, the memory controller can cause a sensing operation (also referred to herein as a read operation) to be performed in order to determine the stored data value in a selected MRAM cell. Specifically, the high positive voltage (VDD) can be applied to the wordline, the read voltage (VREAD) (which is relatively low compared to VDD) can be applied to the bitline and the source line can be connected to ground. In this case, the RP state (i.e., a logic "0") will be indicated by a low voltage on the bitline and an RAP state (i.e., a logic "1") will be indicated by a high voltage on the bitline. To determine the stored data value, the sense amplifier (SA) 331, which is connected to that bitline (e.g., either directly as in the sensing circuit 330A of FIG. 3A or via a multiplexor as in the sensing circuit 330B of FIG. 3B), is employed to compare an electrical parameter on the bitline (i.e., XDATA) to the reference parameter (XREF) from the reference circuit 150A or 150B. In some embodiments, the SA can be configured to compare a bitline voltage (VDATA) to a reference voltage (VREF) from the reference circuit. In this case, if the bitline voltage (VDATA) is below the reference voltage (VREF), a "0" stored data value from the selected memory cell can be output by the sense amplifier 331 and if the bitline voltage (VDATA) is above the reference voltage (VREF), a "1" stored data value from the selected memory cell can be output by the sense amplifier 330. In other embodiments, the SA can be configured to compare a bitline current (IDATA) to a reference current (IREF) from the reference circuit.

As discussed above, in the reference circuit 150A or 150B and, particularly, in the series-parallel resistor network thereof, due to the m parallel-connected MTJs in each group and the m series-connected groups that are programmed according to the above-described programming scheme (i.e., half of the groups having MTJs in the RP state and half of the groups having MTJs in the RAP state), the total resistance ($R_T$) of the network will have low variability and will be essentially equal to half the sum of a nominal RP (i.e., the RP of a nominal MTJ) and a nominal RAP (i.e., the RAP of a nominal MTJ). That is, $R_T \approx (RP_N + RAP_N)/2$) and is ideal for use as a reference resistance. Thus, the reference parameter (XREF, e.g., either VREF or IREF), which is generated by the series-parallel resistor network under specific biasing conditions and which is dependent on the total resistance (RT) of the network (i.e., this RREF), can specifically be generated such that it is at a level midway between two parameter values: a first parameter value associated with the RP state ($X_{RPN}$) of a nominal MTJ and a second parameter value associated with the RAP state (i.e., $X_{RAPN}$) of the nominal MTJ. For example, in the case of VREF, the VREF can be generated so that it is essentially midway between a low voltage (e.g., associated with the RP state of a nominal MTJ) and a high voltage (e.g., associated with the RAP state of a nominal MTJ). The specific biasing conditions applied to the series-parallel resistor network during generation of the reference parameter can include applying the read voltage (VREAD) to only the first wire 196(1) of the first group 190A (e.g., through node A) and connecting the second wire 196(2) of the last group 190m to ground (e.g., through node B).

Figure 5:
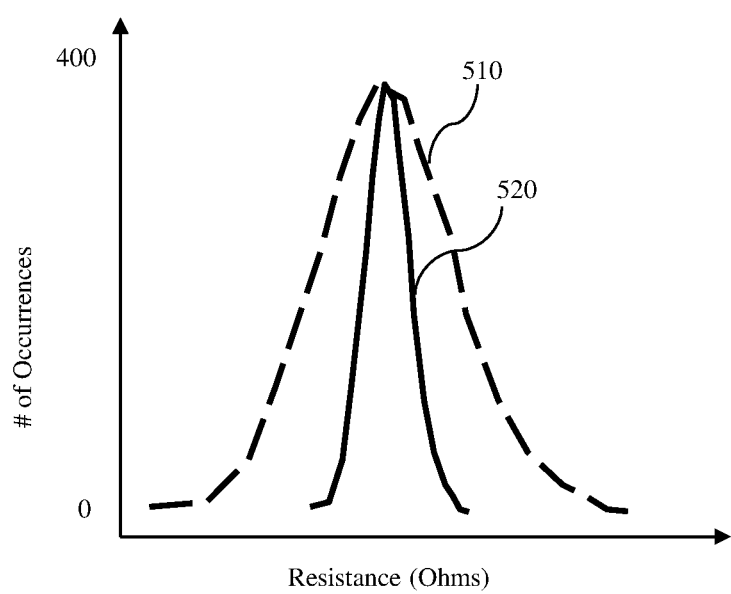
FIG. 5 is a graph showing exemplary curves illustrating exemplary resistance distribution.

Those skilled in the art will recognize that the variability of RREF (and thereby XREF) can be further reduced by increasing the size of the series-parallel resistor network within the reference circuit 150A, 150B (i.e., by incorporating a greater number of m groups of m parallel-connected MTJs). The goal of using the series-parallel resistor network is to capture the average process variations across a large number of MTJs in order to statistically sharpen the resistance distribution. For example, FIG. 5 shows an exemplary first distribution 510 of resistances where the number (m) of series-connected groups of m parallel-connected MTJs is two (i.e., where the series-parallel resistor network has a total of four resistors). FIG. 5 also shows a second distribution 520 of resistances where the number (m) of series-connected groups of m parallel-connected MTJs is four (i.e., where the series-parallel resistor network has a total of sixteen resistors). As illustrated the second distribution 520 is much tighter (i.e., statistically sharper) than the first distribution 510.

Techniques for forming MRAM cell arrays for MRAM structures are well known in the art and, thus, the details have been omitted from this specification in order to allow the reader to focus on the salient aspects of the disclosed embodiments. Generally, during formation of MRAM structure, an array of n-type field effect transistors (NFETs) is formed in a device level on a wafer during front end of the line (FEOL) processing. The source lines, wordlines, MTJs, and bitlines for the MRAM structure are formed during back end of the line (BEOL) processing in different metal levels above the device level. For example, the source lines and wordlines can be patterned and formed in lower BEOL metal levels with the source lines being oriented in a first direction (i.e., oriented the direction of the columns) and the wordlines being oriented in a second direction that is essentially perpendicular to the first direction (i.e., oriented in the direction of the rows). The MTJs can be patterned and formed in another metal level above the source lines and wordlines. The bitlines can be patterned and formed in an upper BEOL metal level of the array of MTJs so as to also be oriented in the first direction. Various BEOL metal vias and middle of the line (MOL) contacts enable the gates of the NFETs in reach row to be connected to be electrically connected to corresponding wordlines and further enable each NFET-MTJ pair (i.e., each MRAM cell) for each column to be connected in series between a lower metal level source line for that column and an upper metal level bitline for that column.

Figure 6:
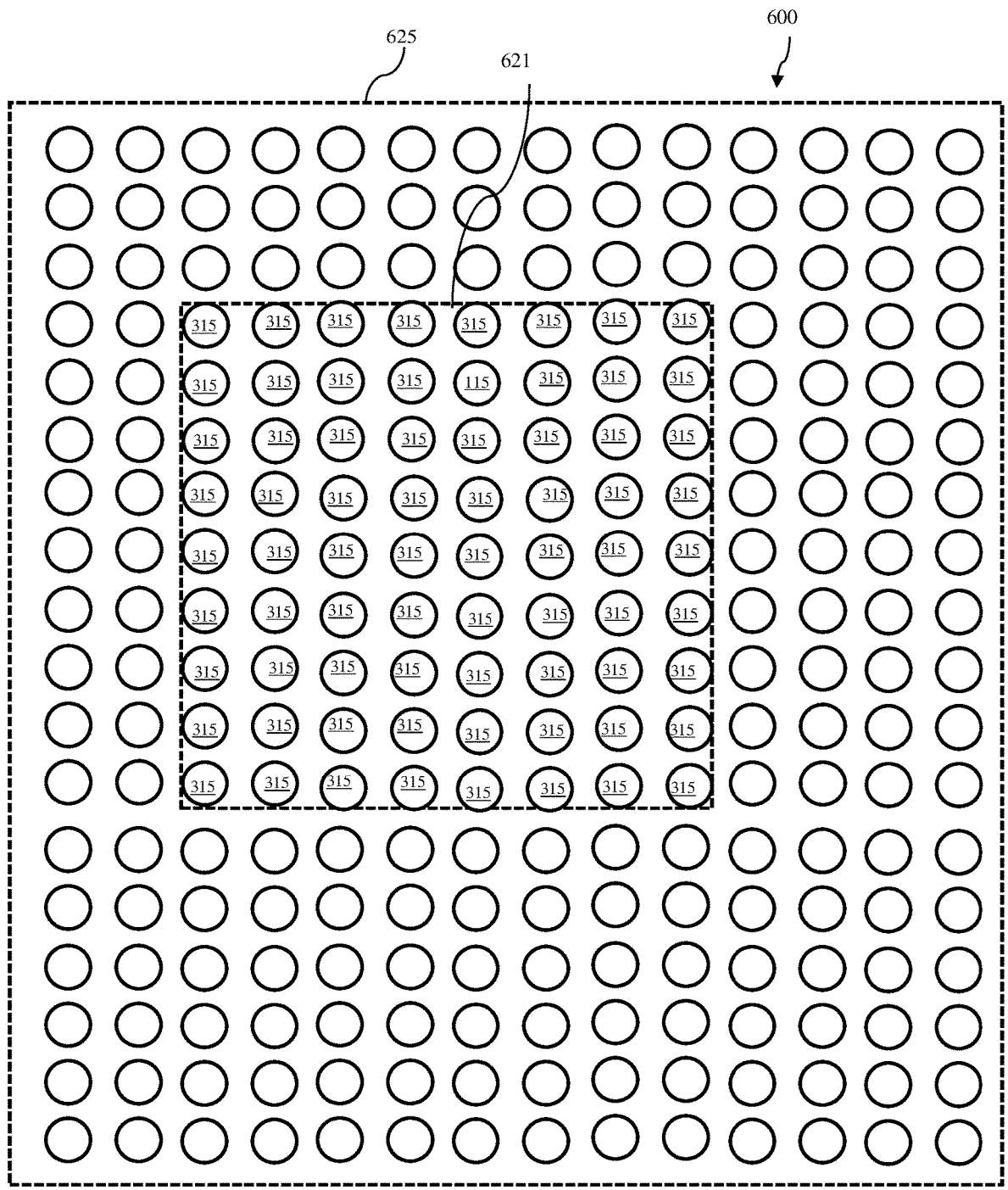
FIG. 6 is a drawing illustrating a sub-array of back end of the line (BEOL) magnetic tunnel junctions (MTJs), which are within a larger BEOL array of the MTJs and which are designated for incorporation into MRAM cells.

Those skilled in the art will recognize that, typically, the MTJs 315 that are incorporated into the MRAM cells of an MRAM array are within a sub-array 621 of a larger array 600, as shown in FIG. 6. That is, a large array 600 of MTJs is typically formed in a given metal level across an entire wafer. A sub-array 621 of the MTJs, which is aligned above the previously formed array of NFETs, can include the MTJs 315 that are to be incorporated into the MRAM cells (e.g., by making the electrical connections described above). Any MTJs that are within the large array 600 of MTJs but outside the sub-array 621 (i.e., that are in the region 625) will not be electrically connected to other circuit components and, more specifically, will remain electrically isolated such that these MTJs are non-functional (also referred to herein as dummy MTJs).

Figure 7:
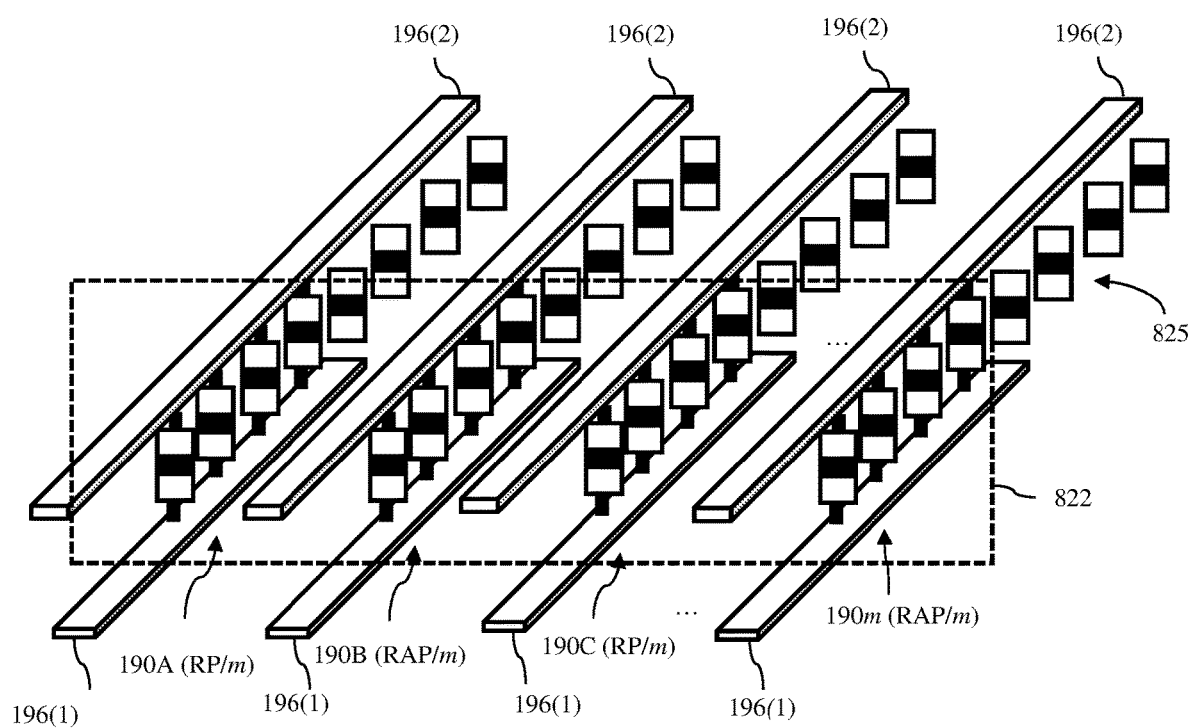
FIG. 7 is a perspective drawing illustrating BEOL formation of the reference circuit.
Figure 8:
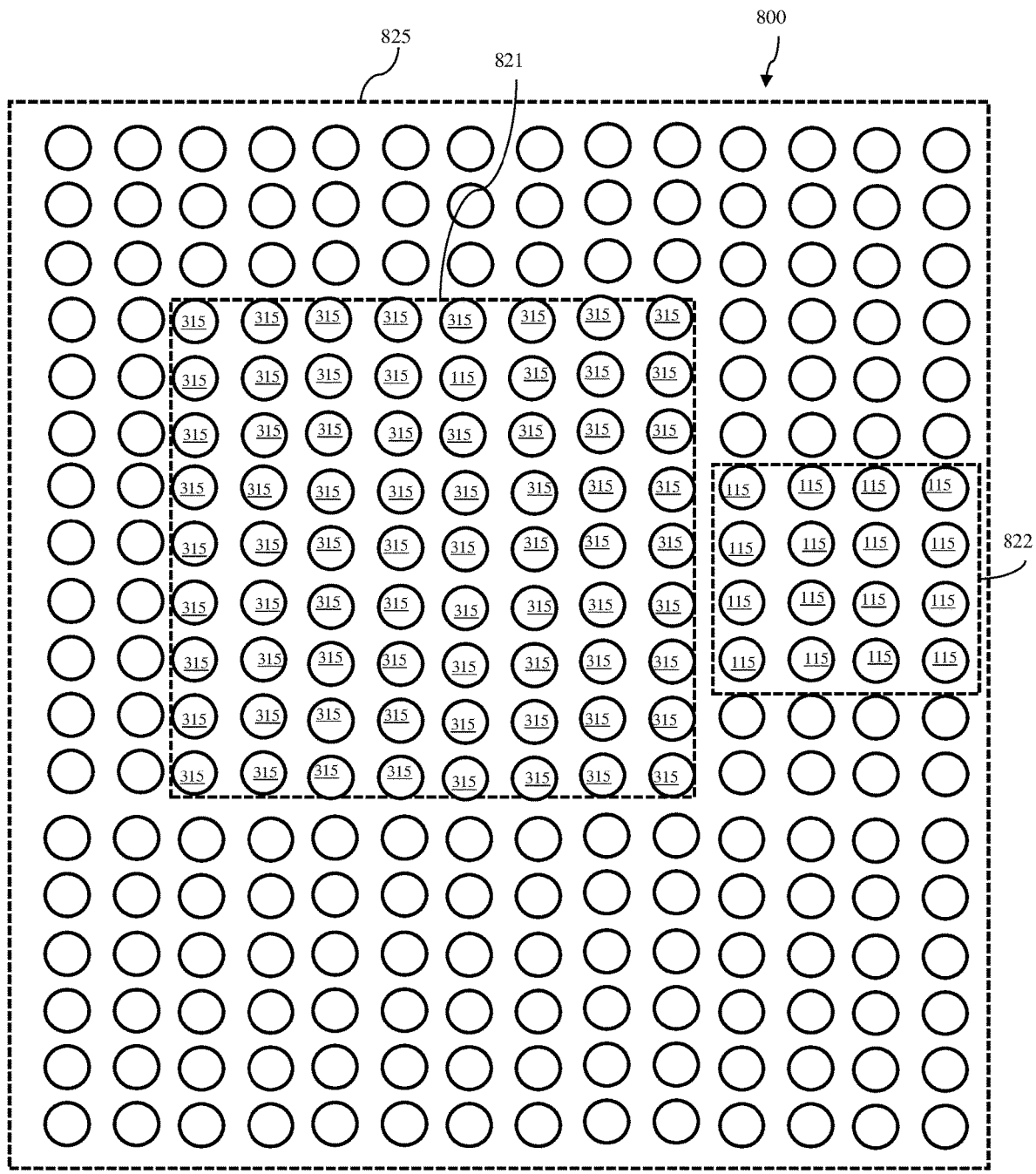
FIG. 8 is a drawing illustrating an array of BEOL MTJs including: a first sub-array of the MTJs, which are designated for incorporation into MRAM cells; a second sub-array, which are designated for incorporation into the reference circuit; and additional MTJs outside the first and second sub-arrays.

It should be noted that formation of the reference circuit 150A, 150B can be readily integrated into this MRAM structure formation processes. For example, referring to FIGS. 7 and 8 in combination, the first wires 196(1) for each group can be concurrently patterned and formed in the same lower metal level and oriented in the same direction as the source lines for the MRAM array, the MTJs $115_1$-$115_m$ for each group can be concurrently patterned and formed in the same metal level as the MTJs 315 for the memory cells of the MRAM array, and the second wires 196(2) for each group can be concurrently patterned and formed in the same upper metal level and oriented in the same direction as the bitlines for the MRAM array. Thus, the parallel-connected MTJs in each group will have stacked layers with the pinned layer 112 being electrically connected by a via to the first wire 196(1) below and with the free layer 114 being electrically connected by a via to the second wire 196(2) above. Furthermore, during BEOL processing, a large array 800 of MTJs can be formed across the wafer. A first sub-array 821, which is within the large array 800 and which is aligned above the previously formed array of NFETs, can include the MTJs 315 that are to be incorporated into the MRAM cells, respectively (e.g., by making the electrical connections described above). A second sub-array 822 of the MTJs, which is within the large array 800 (e.g., to one side of the first sub-array 821), can include the MTJs 115 that are to be incorporated into the reference circuit 150A, 150B (e.g., by making the electrical connects described above). Optionally, additional second sub-array(s) (not shown), which is/are within the large array 800, can include the MTJs that are to be incorporated into additional reference circuit(s) depending upon the MRAM structure design. Finally, other MTJs that are within the large array 800 but outside the first sub-array 821 and any second sub-arrays 822 (i.e., MTJs in the regions 825) will not be electrically connected to other circuit components and, more specifically, will remain electrically isolated such that these MTJs are non-functional (also referred to herein as dummy MTJs).

Figure 9:
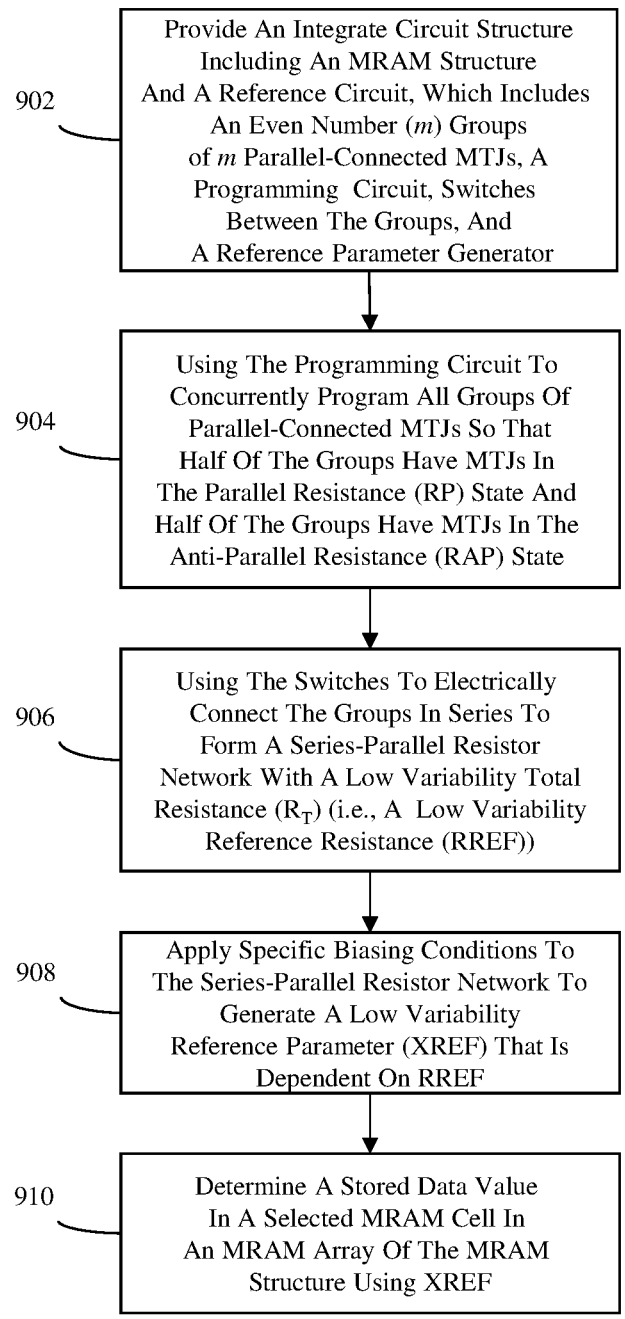
FIG. 9 is a flow diagram illustrating method embodiments for operating the disclosed structures.

Referring to the flow diagram of FIG. 9, also disclosed herein are method embodiments for operating the above-described structures.

Specifically, the method embodiments can include providing an integrated circuit (IC), such as the IC 300A or 300B described in detail above and illustrated in FIG. 3A or 3B, respectively. This IC 300A or 300B can include a magnetic random access memory (MRAM) structure and a reference circuit 150A or 150B, as described in detail above and illustrated in FIG. 1A or 1B, respectively (see process step 902).

The method embodiments can further include concurrently programming all groups 190A-190m of parallel-connected magnetic tunnel junctions (MTJs) in the reference circuit 150A, 150B (see process step 904). As discussed above, the total number of groups of parallel-connected MTJs can be some even number (m) and each of the m groups can include that same number (m) of MTJs. The process of concurrently programming the m groups 190A-190m of parallel-connected MTJs can be performed using a programming circuit 197 of the reference circuit 150A, 150B and can include programming the parallel-connected MTJs in half of the m groups to have a parallel resistance (RP) state and programming the parallel-connected MTJs in another half of the m groups to have an anti-parallel resistance (RAP) state. Specifically, in half of the groups, a low logic value can be applied to the first wire 196(1) and a high logic value can be applied through the access transistor 192 to the second wire 196(2), thereby causing current to flow from the second wire 196(2) through the MTJs $115_1$-$115_m$ to the first wire 196(1) and creating parallel resistance (RP) states in the MTJs $115_1$-$115_m$ (e.g., see FIG. 2A). In the other half of the groups, the high logic value can be applied to the first wire 196(1) and the low logic value can be applied through the access transistor 192 to the second wire 196(2), thereby causing current to flow from the first wire 196(1) through the MTJs $115_1$-$115_m$ to the second wire 196(2) and creating anti-parallel resistance (RAP) states in the MTJs $115_1$-$115_m$ (e.g., see FIG. 2B).

As discussed in detail above with regard to the structure embodiments, the process step 904 can be repeated periodically to ensure that the MTJs in each group remain programmed according to the programming scheme. Concurrent reprogramming of all the groups can be triggered when a driver enable signal (DN) enables all write drivers and a write enable signal (WN) switches to high so that it occurs during each write operation in the MRAM array. Alternatively, this concurrent reprogramming can occur less frequently. For example, the concurrent reprogramming can be triggered when a driver enable signal enables all write drivers and both a write enable signal (WN) and a reference enable signal (RN) switch to high, thereby causing a programming control signal (CS) to switch to high and initiate reprogramming. It should be understood that RN can be generated so that it switches to high less frequently than WN and, thus, so that reprogramming only occurs concurrently with every $x^{th}$ write operation in the MRAM (e.g., with every $10^{th}$ write operation in the MRAM, with every $100^{th}$ write operation in the MRAM, with every $1000^{th}$ write operation in the MRAM, etc.). It should be understood that the schedule for reprogramming of the MTJs can be predetermined to ensure that the MTJs maintain the desired resistance states.

The method embodiments can further include, after concurrently programming the m groups of parallel-connected MTJs and at the initiation of a sensing operation in the MRAM structure, electrically connecting the m groups of parallel-connected MTJs in series (e.g., by turning on switches between the groups) so as to form a series-parallel resistor network (see process step 906). For purposes of this disclosure, it should be understood that a series-parallel resistor network refers to groups of parallel-connected MTJs, wherein the groups are series-connected. Due to the m parallel-connected MTJs in each group and the m series-connected groups that are programmed according to the above-described programming scheme (i.e., half of the groups having MTJs in the RP state and half of the groups having MTJs in the RAP state), the total resistance ($R_T$) of the network will have low variability and will be essentially equal to half the sum of a nominal parallel resistance ($RP_N$) (i.e., the RP of a nominal MTJ in an MRAM cell) and a nominal anti-parallel resistance ($RAP_N$) (i.e., the RAP of a nominal MTJ in an MRAM cell. That is, $R_T \approx (RP_N + RAP_N)/2$). Thus, $R_T$ can subsequently be employed as a low variability reference resistance (RREF).

The method embodiments can further include applying specific biasing conditions to the series-parallel resistor network in order to generate a low variability reference parameter (XREF) that is dependent on this low variability RREF (see process step 908). Specifically, the reference parameter (XREF, e.g., either VREF or IREF) can be generated at process step 908 by the series-parallel resistor network under the specific biasing conditions such that it is dependent on RREF and further such that it is at a level midway between two parameter values: a first parameter value associated with the RP state ($X_{RPN}$) of a nominal MTJ and a second parameter value associated with the RAP state (i.e., $X_{RAPN}$) of the nominal MTJ. For example, in the case of VREF, the VREF can be generated so that it is essentially midway between a low voltage (e.g., associated with the RP state of a nominal MTJ) and a high voltage (e.g., associated with the RAP state of a nominal MTJ). The specific biasing conditions can include applying the read voltage (VREAD) to only the first wire 196(1) of the first group 190A (e.g., through node A) and connecting the second wire 196(2) of the last group 190m to ground (e.g., through node B). As discussed below, VREAD is a relatively low voltage (as compared to VDD) and is it applied to a bitline during a read operation.

The method embodiments can further include performing a sensing operation using the XREF from the reference circuit 150A, 150B in order to determine a stored data value in a selected MRAM cell in the MRAM structure of the IC 300A, 300B (see process step 910). Specifically, the process of performing the sensing operation can include applying a high positive voltage (VDD) to the wordline connected to a selected MRAM cell, applying VREAD (which as mentioned above is a positive voltage that is lower than VDD) to the bitline connected to the selected MRAM cell and discharging the source line connected to the selected MRAM cell to ground. An MTJ within the selected MRAM cell and in the RP state (i.e., storing a logic "0") will be indicated by a low voltage on the bitline and an MTJ within the selected MRAM cell and in the RAP state (i.e., storing a logic "1") will be indicated by a high voltage on the bitline. In order to determine the stored data value in the selected MRAM cell, a sense amplifier (SA) 331(which is either directly connected to the bitline, as in the MRAM structure 300A of FIG. 3A, or connected to a selected bitline via a multiplexor 325, see the MRAM structure 300B of FIG. 3B) can be employed to compare a bitline parameter (XDATA) on the bitline to the reference parameter (XREF) from the reference circuit 150A, 150B. Depending upon whether XDATA is above or below the XREF, a stored data value from the selected MRAM cell can be output. For example, in the case where the bitline parameter is a bitline voltage (VDATA) and the reference parameter (XREF) is a reference voltage (VREF), if the VDATA is below the VREF, a "0" stored data value can be output and if VDATA is above the VREF, a "1" stored data value can be output.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A reference circuit comprising:
    groups of parallel-connected magnetic tunnel junctions, wherein the parallel-connected magnetic tunnel junctions in each group are connected between a first wire and a second wire;
    a programming circuit connected to the groups, wherein the programming circuit is configured so that the parallel-connected magnetic tunnel junctions in half of the groups are programmable to have a parallel resistance state and so that the parallel-connected magnetic tunnel junctions in another half of the groups are programmable to have an anti-parallel resistance state and wherein the programming circuit comprises, for each group, a first write driver connected to the first wire; a second write driver connected to the second wire; and a flip-flop connected to the first write driver and the second write driver; and
    switches operable to form a series-parallel resistor network by electrically connecting the groups in series.

2. The reference circuit of claim 1,
    wherein a total number of the groups is an even number equal to a total number of the parallel-connected magnetic tunnel junctions in each group such that a total resistance of the series-parallel resistor network is approximately equal to a sum of a nominal parallel resistance and a nominal anti-parallel resistance divided by two,
    wherein the reference circuit further comprises a reference parameter output block, and
    wherein under specific biasing conditions the series-parallel resistor network generates a reference parameter that is dependent on the total resistance and the reference parameter output block outputs the reference parameter.

3. The reference circuit of claim 1,
    wherein the switches comprise transmission gates controlled by a sense enable signal and an inverted sense enable signal, and
    wherein each transmission gate is connected between nodes on the second wire of one group and the first wire of an adjacent group.

4. The reference circuit of claim 1,
    wherein each magnetic tunnel junction in each group comprises a pinned layer connected to the first wire for the group, a free layer connected to the second wire for the group, and a dielectric layer between the pinned layer and the free layer,
    wherein for each group, the first write driver is electrically connected directly to the first wire and the second write driver is electrically connected by an access transistor to the second wire, and
    wherein the programming circuit further comprises:
        for each first group that is programmable to have the parallel resistance state, a first flip-flop outputting a low logic value to the first write driver and a high logic value to the second write driver; and
        for each second group that is programmable to have the anti-parallel resistance state, a second flip-flop outputting the high logic value to the first write driver and the low logic value to the second write driver.

5. The reference circuit of claim 4,
    wherein the programming circuit initiates magnetic tunnel junction resistance programming whenever a driver enable signal controlling all write drivers and a write enable signal controlling all access transistors have high logic values so that:
        within each first group, the low logic value is applied to the first wire and the high logic value is applied through the access transistor to the second wire causing current to flow from the second wire to the first wire and creating parallel resistance states in the parallel-connected magnetic tunnel junctions; and
        within each second group, the high logic value is applied to the first wire and the low logic value is applied through the access transistor to the second wire causing current to flow from the first wire to the second wire and creating anti-parallel resistance states in the parallel-connected magnetic tunnel junctions.

6. The reference circuit of claim 4, further comprising a NAND logic gate receiving a write enable signal and a reference enable signal and outputting a programming control signal that only has a high logic value when both the write enable signal and the reference enable signal have high logic values, wherein the programming circuit initiates magnetic tunnel junction resistance programming whenever a driver enable signal controlling all write drivers and the programming circuit controlling all access transistors have high logic values so that:

within each first group, the low logic value is applied to the first wire and the high logic value is applied through the access transistor to the second wire causing current to flow from the second wire to the first wire and creating parallel resistance states in the parallel-connected magnetic tunnel junctions; and within each second group, the high logic value is applied to the first wire and the low logic value is applied through the access transistor to the second wire causing current to flow from the first wire to the second wire and creating anti-parallel resistance states in the parallel-connected magnetic tunnel junctions.

7. The reference circuit of claim 4, further comprising a reference parameter output block, wherein under specific biasing conditions the series-parallel resistor network generates a reference parameter that is dependent on a total resistance of the series-parallel resistor network and the reference parameter output block supplies the reference parameter to a memory array of a memory structure to be employed when determining a stored data value in a selected memory cell in the memory array, wherein an array of magnetic tunnel junctions comprises a first sub-array, a second sub-array and additional magnetic tunnel junctions outside the first sub-array and the second sub-array, wherein, within the first sub-array, the magnetic tunnel junctions are incorporated into the groups, wherein, within the second sub-array, the magnetic tunnel junctions are connected to field effect transistors below a metal level and are incorporated into magnetic random access memory cells in the memory array, and wherein the additional magnetic tunnel junctions are electrically isolated and non-functional.

8. The reference circuit of claim 7, wherein all first wires for the groups are in a lower metal level between the field effect transistors and the array, wherein the lower metal level further comprises source lines for the memory structure, and wherein all second wires for the groups are in an upper metal level above the array, wherein the upper metal level further comprises bitlines for the memory structure.

9. An integrated circuit comprising:

a reference circuit comprising:

groups of parallel-connected magnetic tunnel junctions, wherein the parallel-connected magnetic tunnel junctions in each group are connected between a first wire and a second wire;

a programming circuit connected to the groups, wherein the programming circuit is configured so that the parallel-connected magnetic tunnel junctions in half of the groups are programmable to have a parallel resistance state and the parallel-connected magnetic tunnel junctions in another half of the groups are programmable to have an anti-parallel resistance state and wherein the programming circuit comprises, for each group, a first write driver connected to the first wire; a second write driver connected to the second wire; and a flip-flop connected to the first write driver and the second write driver;

switches selectively operable to form a series-parallel resistor network by electrically connecting the groups in series; and a reference parameter output block, wherein under specific biasing conditions the series-parallel resistor network generates a reference parameter that is dependent on a total resistance of the series-parallel resistor network and the reference parameter output block outputs the reference parameter; and a memory structure comprising a memory array of magnetic random access memory cells and a sensing circuit that receives the reference parameter and uses the reference parameter to determine a stored data value in a selected memory cell.

10. The integrated circuit of claim 9, wherein a total number of the groups is an even number equal to a total number of the parallel-connected magnetic tunnel junctions in each group such that the total resistance is approximately equal to a sum of a nominal parallel resistance and a nominal anti-parallel resistance divided by two.

11. The integrated circuit of claim 9, wherein the reference parameter is any of a reference voltage and a reference current.

12. The integrated circuit of claim 9, wherein the switches comprise transmission gates controlled by a sense enable signal and an inverted sense enable signal, and wherein each transmission gate is connected between nodes on the second wire of one group and the first wire of an adjacent group.

13. The integrated circuit of claim 9, wherein each magnetic tunnel junction in each group comprises a pinned layer connected to the first wire for the group, a free layer connected to the second wire for the group, and a dielectric layer between the pinned layer and the free layer, wherein for each group, the first write driver is electrically connected directly to the first wire and the second write driver is electrically connected by an access transistor to the second wire, and wherein the programming circuit further comprises:

for each first group programmable to have the parallel resistance state, a first flip-flop outputting a low logic value to the first write driver and a high logic value to the second write driver; and for each second group programmable to have the anti-parallel resistance state, a second flip-flop outputting the high logic value to the first write driver and the low logic value to the second write driver.

14. The integrated circuit of claim 13, wherein the programming circuit initiates magnetic tunnel junction resistance programming whenever a driver enable signal controlling all write drivers and a write enable signal controlling all access transistors have high logic values so that:

within each first group, the low logic value is applied to the first wire and the high logic value is applied through the access transistor to the second wire causing current to flow from the second wire to the first wire and creating parallel resistance states in the parallel-connected magnetic tunnel junctions; and within each second group, the high logic value is applied to the first wire and the low logic value is applied through the access transistor to the second wire causing current to flow from the first wire to the second wire and creating anti-parallel resistance states in the parallel-connected magnetic tunnel junctions.

15. The integrated circuit of claim 13, wherein the reference circuit further comprises a AND logic gate receiving a write enable signal and a reference enable signal and outputting a programming control signal that only has a high logic value when both the write enable signal and the reference enable signal have high logic values, and wherein the programming circuit initiates magnetic tunnel junction resistance programming whenever a driver enable signal controlling all write drivers and the programming circuit controlling all access transistors have high logic values so that:

within each first group, the low logic value is applied to the first wire and the high logic value is applied through the access transistor to the second wire causing current to flow from the second wire to the first wire and creating parallel resistance states in the parallel-connected magnetic tunnel junctions; and within each second group, the high logic value is applied to the first wire and the low logic value is applied through the access transistor to the second wire causing current to flow from the first wire to the second wire and creating anti-parallel resistance states in the parallel-connected magnetic tunnel junctions.

16. The integrated circuit of claim 13, further comprising:

a metal level comprising an array of magnetic tunnel junctions comprising a first sub-array, a second sub-array and additional magnetic tunnel junctions outside the first sub-array and the second sub-array, wherein, within the first sub-array, the magnetic tunnel junctions are incorporated into the groups, wherein, within the second sub-array, the magnetic tunnel junctions are connected to field effect transistors below the metal level and are incorporated into magnetic random access memory cells in the memory array, and wherein the additional magnetic tunnel junctions are electrically isolated and non-functional;

a lower metal level between the field effect transistors and the array, wherein the lower metal level comprises source lines for the memory structure and all first wires for the groups; and an upper metal level above the array, wherein the upper metal level comprises bitlines for the memory structure and all second wires for the groups.

17. A method comprising:

concurrently programming groups of parallel-connected magnetic tunnel junctions, wherein the parallel-connected magnetic tunnel junctions in each group are connected between a first wire and a second wire, and wherein the concurrently programming is performed using a programming circuit comprising, for each group, a first write driver connected to the first wire; a second write driver connected to the second wire; and a flip-flop connected to the first write driver and the second write driver, and wherein the concurrently programming comprises programming the parallel-connected magnetic tunnel junctions in half of the groups to have a parallel resistance state and programming the parallel-connected magnetic tunnel junctions in another half of the groups to have an anti-parallel resistance state; and electrically connecting the groups in series so as to form a series-parallel resistor network, wherein the electrically connecting of the groups in series comprises turning on switches between the groups.

18. The method of claim 17, wherein a total number of the groups is an even number equal to a total number of the parallel-connected magnetic tunnel junctions in each group such that a total resistance of the series-parallel resistor network is approximately equal to a sum of a nominal parallel resistance and a nominal anti-parallel resistance divided by two.

19. The method of claim 17, further comprising:

applying specific biasing conditions to the series-parallel resistor network to generate a reference parameter that is dependent on a total resistance of the series-parallel resistor network; and determining a stored data value in a selected memory cell in a memory array of a memory structure using the reference parameter.

20. The method of claim 17, wherein the switches comprise transmission gates, each transmission gate being connected between nodes on the second wire of one group and the first wire of an adjacent group, and wherein the method further comprises controlling the transmission gates using a sense enable signal and an inverted sense enable signal.

* * * * *